(12) United States Patent
Inagaki et al.

(10) Patent No.: US 7,859,032 B2
(45) Date of Patent: Dec. 28, 2010

(54) SOLID-STATE IMAGING DEVICE AND METHOD FOR DRIVING THE SAME

(75) Inventors: Makoto Inagaki, Kyoto (JP); Yoshiyuki Matsunaga, Kyoto (JP)

(73) Assignee: Panasonic Corporation, Osaka (JP)

( * ) Notice: Subject to any disclaimer, the term of this patent is extended or adjusted under 35 U.S.C. 154(b) by 653 days.

(21) Appl. No.: 11/883,556

(22) PCT Filed: Jul. 21, 2005

(86) PCT No.: PCT/JP2005/013363

§ 371 (c)(1),
(2), (4) Date: Aug. 2, 2007

(87) PCT Pub. No.: WO2006/090492

PCT Pub. Date: Aug. 31, 2006

(65) Prior Publication Data

US 2008/0087925 A1    Apr. 17, 2008

(30) Foreign Application Priority Data

Feb. 25, 2005    (JP) .............................. 2005-051513

(51) Int. Cl.
*H01L 31/062* (2006.01)
*H01L 31/113* (2006.01)
*H01L 27/148* (2006.01)

(52) U.S. Cl. ...................... 257/292; 257/222; 257/223; 257/E27.132

(58) Field of Classification Search ......... 257/222–224, 257/291, 292, E27.13, E27.131, E27.132, 257/E27.133, E27.15, E27.151, E27.154; 348/308, 314

See application file for complete search history.

(56) References Cited

U.S. PATENT DOCUMENTS 6,472,698 B1 * 10/2002 Nakashiba ................... 257/222
6,946,637 B2 *  9/2005 Kochi et al. .............. 250/208.1

(Continued)

FOREIGN PATENT DOCUMENTS

EP    1 530 239 A2    5/2005

(Continued)

OTHER PUBLICATIONS

Chinese Office Action issued in Chinese Patent Application No. CN 2005800486790, dated Nov. 7, 2008.

(Continued)

*Primary Examiner*—Shouxiang Hu
(74) *Attorney, Agent, or Firm*—McDermott Will & Emery LLP

(57) ABSTRACT

During an exposure time period (long accumulation time period) of a low shutter speed shooting mode, a second reference voltage Vss2, which is different from a first reference voltage Vss1 (a ground voltage) corresponding to a reference voltage of a peripheral circuit, is applied to a well (5) where a photoelectric converter section (2) and a drain region (4) are formed, whereby generation of dark electrons at a portion of a surface of the well (5) below a gate electrode (6) is suppressed. A polarity of the second reference voltage Vss2 is positive in the case where a conductivity type of the well (5) is a P-type, and is negative in the case of an N-type.

3 Claims, 11 Drawing Sheets

U.S. PATENT DOCUMENTS

| | | | |
|---|---|---|---|
| 2001/0002847 A1* | 6/2001 | Kanbe | 348/296 |
| 2001/0012133 A1 | 8/2001 | Yoneda et al. | |
| 2002/0017661 A1* | 2/2002 | Shinohara | 257/238 |
| 2002/0020845 A1* | 2/2002 | Ogura et al. | 257/88 |
| 2005/0224841 A1 | 10/2005 | Nakamura et al. | |

FOREIGN PATENT DOCUMENTS

| | | |
|---|---|---|
| EP | 1 801 876 A1 | 6/2007 |
| JP | 08-213586 | 8/1996 |
| JP | 10-308507 | 11/1998 |
| JP | 11-274459 | 10/1999 |
| JP | 2000-150856 | 5/2000 |
| JP | 2002-353433 | 12/2002 |
| JP | 2004-128296 | 4/2004 |
| JP | 2005-072795 | 3/2005 |
| WO | WO 03/085964 A1 | 10/2003 |

OTHER PUBLICATIONS

European Search Report issued in European Patent Application No. EP 05 76 6443, mailed May 8, 2008.

Japanese Notice of Reasons for Rejection issued in Japanese Patent Application No. JP 2005-051513 dated Jun. 16, 2009.

* cited by examiner (a)

(b)

(c) POTENTIAL ON
SUBSTRATE SURFACE
[V]

(a)

(b)

(c)

POTENTIAL ON
SUBSTRATE SURFACE
[V]

SOLID-STATE IMAGING DEVICE AND METHOD FOR DRIVING THE SAME

RELATED APPLICATIONS

This application is the U.S. National Phase under 35 U.S.C. §371 of International Application No. PCT/JP2005/013363, filed on Jul. 21, 2005, which in turn claims the benefit of, Japanese Application No. 2005-051513, filed on Feb. 25, 2005, the disclosure of which Applications is incorporated by reference herein.

TECHNICAL FIELD

The present invention relates to a solid-state imaging device used for a home video camera, a digital still camera, a cellular phone camera and the like, and a method for driving the same.

BACKGROUND ART

FIG. 9(a) is a top view of a unit pixel section of a conventional MOS solid-state imaging device (an amplification type image sensor). FIG. 9(b) is a cross-sectional view of FIG. 9(a) along an A-A' line. In a well 105, which is formed by adding a P-type impurity to a surface of a semiconductor substrate 110, a photoelectric converter section 102, a hole storage layer 103 and a drain region 104 are formed. A conductivity type of the photoelectric converter section 102 and the drain region 104 is an N-type, and the conductivity type of the hole storage layer 103 is a P-type. The photoelectric converter section 102 forms a PN junction with the well 105, thereby constituting a photodiode. An element isolating region 111 is formed around a region including the photoelectric converter section 102 and the drain region 104. A gate electrode 106 is situated above a surface of the well 105 having an insulating film 109 sandwiched therebetween.

The photoelectric converter section 102, the drain region 104, and the gate electrode 106 respectively correspond to a source, a drain and a gate of the MOS transistor, and thus this type of solid-state imaging device is called a MOS solid-state imaging device. Light condensed by a microlens, which is not shown, is incident on the photoelectric converter section 102, and a signal charge (free electrons) corresponding to an amount of the incident light is accumulated thereon. The hole storage layer 103 is provided so as to reduce a dark output.

A plurality of the unit pixel sections, each including an amplifying transistor which amplifies an output of the drain region 104, a reset transistor which discharges a signal charge of the drain region 104 and the like, is situated in a photoreceptor region of a chip in a matrix format. In a peripheral circuit region, which is a peripheral region of the photoreceptor region, a vertical scanning circuit and a horizontal scanning circuit are situated so as to drive each of the unit pixel sections. As shown in FIG. 10, which is a schematic cross-sectional view of the solid-state imaging device, to the well 105 in a photoreceptor region 130 and a peripheral circuit region 140, a reference voltage Vss (a ground voltage) is supplied constantly through reference voltage wiring 112.

When a gate voltage is applied to the gate electrode 106 of a transistor 101, a channel is formed in the surface of the well 105, and the signal charge accumulated in the photoelectric converter section 102 is transferred to the drain region 104. The drain region 104 temporarily accumulates the signal charge, and outputs a voltage signal corresponding to an amount of the signal charge.

FIG. 9(c) shows a potential of the surface of the well 105 in a stationary state. The stationary state is a state where no voltage is applied to the gate electrode 106. In the stationary state, a potential of the well 105 of a P-conductivity type is low, and a potential of the photoelectric converter section 102 and the drain region 104, which are each of a N-conductivity type, is high, and a potential changes gradually at a PN junction portion. Since a surface defect is generated in the surface of the well 105 due to a stress at the time of forming the insulating film 109, there are many free electrons in this area. In the stationary state, a region having the surface defect is covered by a depletion layer which is generated at a junction between the well 105 and the photoelectric converter section 102, and also by a depletion layer which is generated at a portion of the surface of the well 105 under the gate electrode 106, and thus free electrons caused by the surface defect flow along an electric field in the depletion layers, and are accumulated in the photoelectric converter section 102 as dark electrons.

FIG. 11 shows the surface defect and a depletion layer DL as viewed from the cross-section of FIG. 9(a) along a B-B' line. At an interface between the well 105 (an active region) and an element isolating region 111 (a non-active region), a surface defect SD is generated due to a stress at the time of forming the element isolating region 111, there are many free electrons at the interface. In the stationary state, since the surface defect SD is covered by the depletion layer DL generated at the portion of the surface of the well 105 under the gate electrode 106, free electrons caused by the surface defect SD flow along the electric field in the depletion layer DL, and are accumulated in the photoelectric converter section 102 as the dark electrons.

An accumulated amount of the dark electrons depends on a length of an exposure time, and thus in the case of shooting in a shooting mode for a long exposure time such as a shooting in a low-light environment, such problems will be caused as increases in the dark output and in variation in a dark signal among pixels, and deterioration in a white spot defect and the like. As is already applied to some of CCD solid-state imaging devices, an exemplary method for making the potential of the back gate region 113 almost 0V (pinning) by applying a negative voltage to the gate electrode 106 is suggested in order to solve the problem. Alternatively, a method for reducing an expansion of the depletion layer DL by increasing a threshold voltage Vth of the transistor 101 is suggested (see patent document 1).

Patent document 1: Japanese Laid-Open Patent Publication No. 11-274459

DISCLOSURE OF THE INVENTION

Problems to be Solved by the Invention

However, in the case of adopting the former method, the negative voltage has to be generated from the power supply voltage Vdd, which is a positive voltage, and thus a peripheral circuit will become complicated. On the other hand, in the case of adopting the latter method, it takes time to increase the potential of the back gate region 113 at the time of applying a voltage to the gate electrode 106, and consequently time available for transferring a signal charge becomes shorter than a predetermined time. As a result, the signal charge cannot be transferred sufficiently to the drain region 104, thereby leading to a problem such as an after-image or a kTC noise caused by the signal charge remaining in the photoelectric converter section 102.

Therefore, the present invention is aimed to provide a solid-state imaging device capable of suppressing the dark electrons generated at the portion of the surface of the well under the gate electrode, avoiding a complicated control method or circuit, and preventing a problem such as the after-image and the kTC noise from occurring, and a method for driving the same.

Solution to the Problems

The solid-state imaging device according to the present invention is a solid-state imaging device having a plurality of unit pixel sections, which are situated in a matrix format, and a peripheral circuit thereof provided in a well of a semiconductor substrate, the solid-state imaging device comprising: a well of a first conductivity type which is formed from a surface to an inside of the semiconductor substrate; and a reference voltage supply wiring for switchingly supplying a first reference voltage, which is a reference voltage of the peripheral circuit, and a second reference voltage, which is larger in a absolute voltage than the first reference voltage and is identical in polarity to a power supply voltage, to the well, each of the plurality of unit pixel sections includes: a photoelectric converter section which is a region of a second conductivity type formed from a surface to an inside of the well and accumulates a signal charge obtained through a photoelectric conversion of an incident light; a gate electrode which is formed on the well and transfers, upon reception of a supply of a voltage from the peripheral circuit, the signal charge accumulated in the photoelectric converter section; and a drain region, which is a region of the second conductivity type formed from the surface to the inside of the well and temporarily accumulates the signal charge transferred by the gate electrode.

The well may include: a photoreceptor section well having the plurality of unit pixel sections situated thereon; and a peripheral circuit well having the peripheral circuit situated thereon, the reference voltage supply wiring includes: a photoreceptor section reference voltage wiring for switchingly supplying the first reference voltage and the second reference voltage to the photoreceptor section well; and a peripheral circuit reference voltage wiring for supplying the first reference voltage to the peripheral circuit well.

A method for driving a solid-state imaging device is a method for driving a solid-state imaging device having a photoreceptor section, which has a plurality of unit pixel sections situated thereon in a matrix format, and a peripheral circuit thereof formed in a well of a semiconductor substrate, the plurality of unit pixel sections each including a photoelectric converter section for accumulating a signal charge obtained through photoelectric conversion of an incident light, a gate electrode for transferring the signal charge accumulated in the photoelectric converter section upon reception of a supply of a voltage and a drain region for temporarily accumulating the signal charge transferred by the gate electrode, wherein, to the well, a first reference voltage, which is a reference voltage of the peripheral circuit, and a second reference voltage, which is larger in an absolute value than the first reference voltage and is identical in polarity to a power supply voltage, are supplied switchingly.

The well includes: a photoreceptor section well having the plurality of unit pixel sections situated thereon; and a peripheral circuit well having the peripheral circuit situated thereon, the first reference voltage and the second reference voltage are switchingly supplied to the photoreceptor section well, and the first reference voltage is constantly supplied to the peripheral circuit well.

Further, to the well, the first reference voltage is basically supplied, and the second reference voltage may be supplied during an exposure time period.

Effect of the Invention

In a solid-state imaging device and a method for driving the same according to the present invention, a second reference voltage which is different from a first reference voltage similar to a ground voltage, is applied to a well provided in a unit pixel section, whereby a potential in the vicinity of a portion of a surface of a well under a gate electrode becomes almost 0 regardless of a position. Accordingly, generation of dark electrons, which has conventionally been a problem, can be suppressed. Therefore, according to the solid-state imaging device based on the present invention, it is possible to suppress a dark output at the time of long accumulation, variation in the dark output of the unit pixel section and deterioration in a white spot defect. Further, since an after-image or a kTC noise hardly occurs, a preferable image can be obtained.

The more significant an amount of the dark electrons generated in the vicinity of the portion of the surface of the well under the gate electrode becomes, the longer an exposure time becomes. Therefore, the second reference voltage is applied only during a time period when the generated dark electron has a significant impact, whereby an effect such as reduction in the dark output can be obtained. Further, in the case where the second reference voltage is pulsed and where the first reference voltage is applied at a time when second reference voltage is unnecessary, a power supply voltage which is larger than a power supply voltage Vdd of a conventional solid-state imaging device is not required, or power consumption will not be increased.

BRIEF DESCRIPTION OF THE DRAWINGS

FIG. 11 is a diagram illustrating a position where a surface defect exists and an expansion of a depletion layer in a cross-section of FIG. 9 along a B-B' line.

Figure 1:
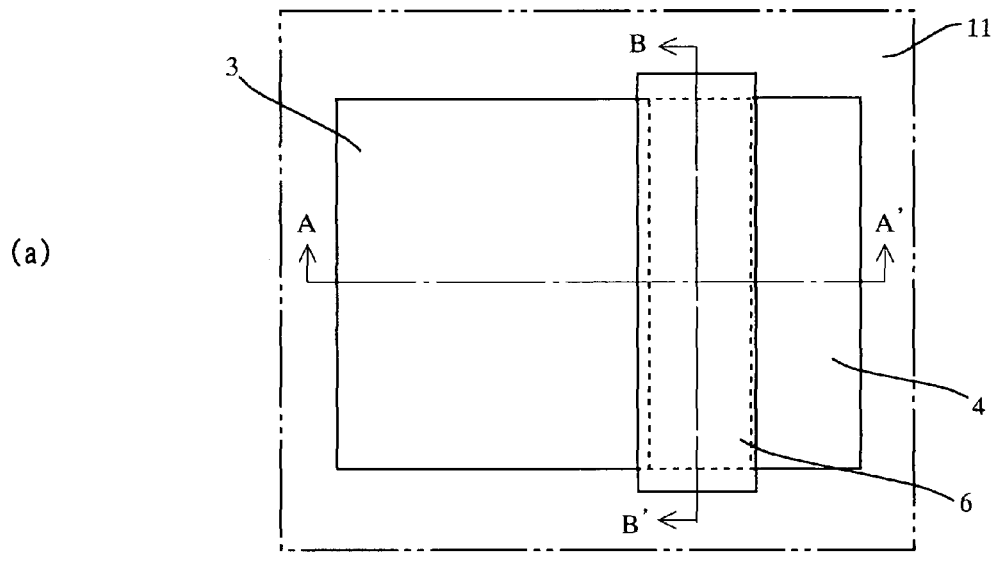
FIG. 1 is a diagram illustrating a partial top view, a cross-sectional view and a well surface potential of a unit pixel region of a solid-state imaging device according to the present invention.
Figure 1:
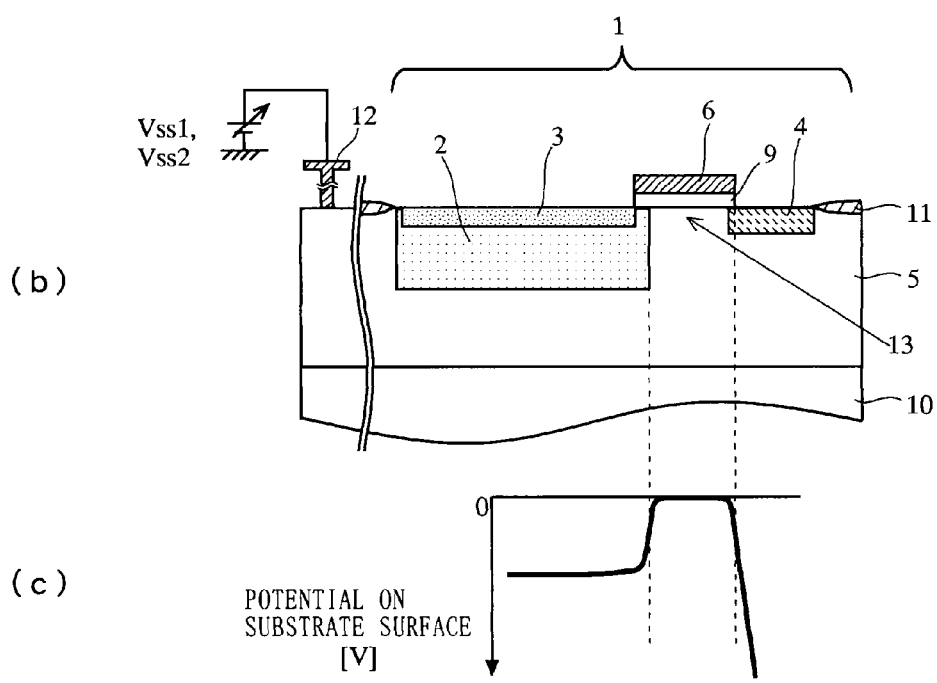

DESCRIPTION OF THE REFERENCE CHARACTERS 1 transistor
2 photoelectric converter section
3 hole storage layer
4 drain region
5 well
6 gate electrode
7 amplifying transistor
8 reset transistor
9 insulating film
10 semiconductor substrate
11 isolated region
12 reference voltage wiring
13 back gate region
14 unit pixel section
15 vertical scanning circuit
16 noise reduction circuit
17 horizontal scanning circuit
18 amplifier circuit
19 output terminal
20a chip
20b chip
24 reference voltage supply terminal
30 photoreceptor region
32 photoreceptor section reference voltage wiring
34 reference voltage supply terminal
35 photoreceptor section well
40 peripheral circuit region
42 peripheral circuit reference voltage wiring
44 reference voltage supply terminal
45 peripheral circuit well
101 transistor
102 photoelectric converter section
103 hole storage layer
104 drain region
105 well
106 gate electrode
107 amplifying transistor
108 reset transistor
109 insulating film
110 substrate
111 element isolating region
112 reference voltage wiring
113 back gate region

BEST MODE FOR CARRYING OUT THE INVENTION

First Embodiment

FIG. 1(a) is a top view of a unit pixel section of a MOS solid-state imaging device (an amplification type image sensor) according to a first embodiment of the present invention. FIG. 1(b) is a cross-sectional view of FIG. 1(a) along an A-A' line. The unit pixel section includes a photoelectric converter section 2, a hole storage layer 3 and drain region 4 which are formed in the well 5 of the semiconductor substrate 10, and a gate electrode 6 which is formed above the well 5 having an insulating film 9 sandwiched therebetween. A conductivity type of the well 5 and the hole storage layer 3 is a P-type, and the conductivity type of the photoelectric converter section 2 and the drain region 4 is an N-type. The photoelectric converter section 2 forms a PN junction with the well 5, thereby constituting a photodiode. An element isolating region 11 is formed around a region including the photoelectric converter section 2 and the drain region 4. The hole storage layer 3 is provided for the purpose of suppressing a dark output.

Figure 2:
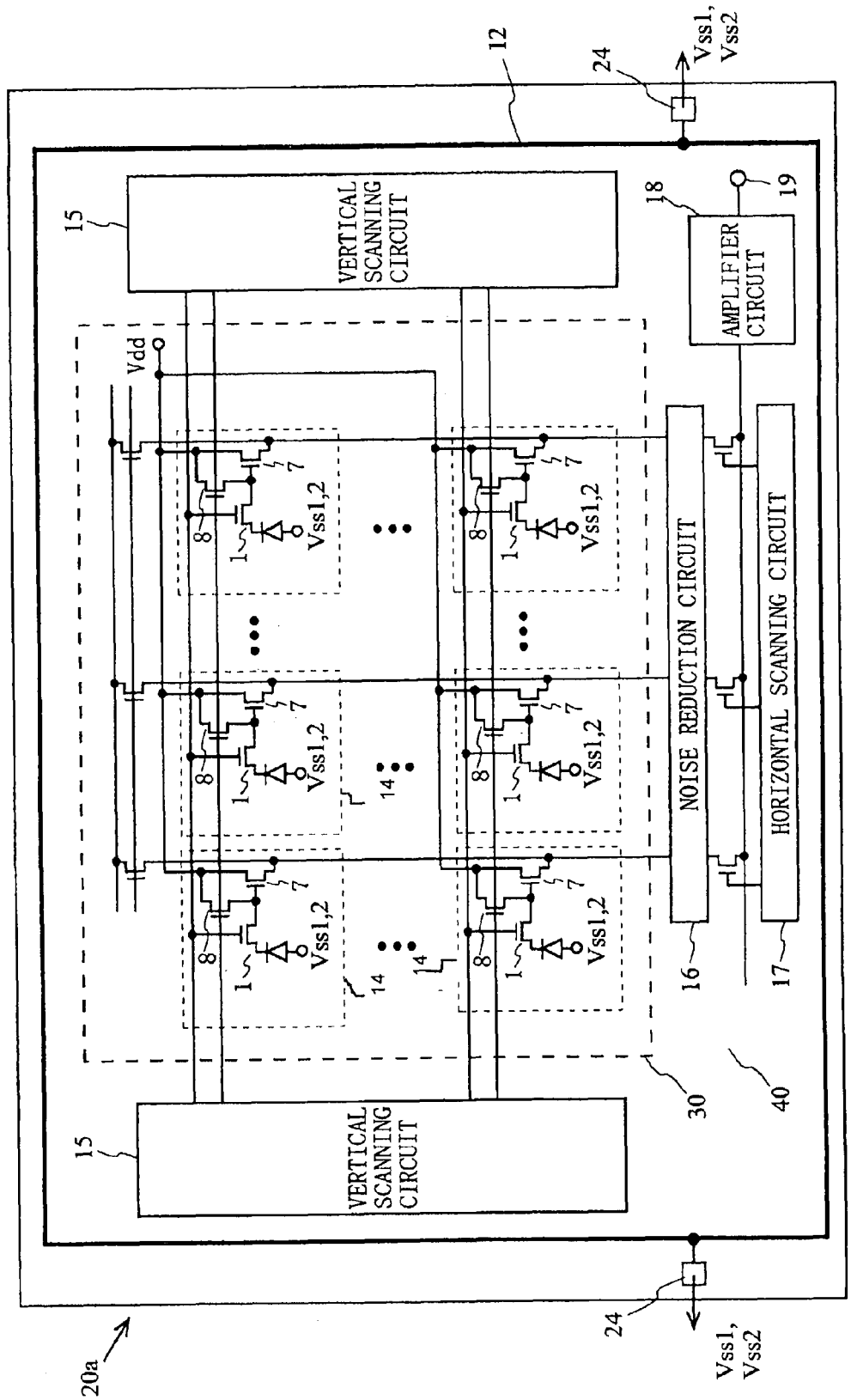
FIG. 2 is an exemplary circuit of a solid-state imaging device according to a first embodiment of the present invention.

Since the photoelectric converter section 2, the drain region 4 and the gate electrode 6, correspond to a source, a drain, and a gate of a MOS transistor, respectively, these sections will be collectively referred to as a transistor 1 in the present specification. Light condensed by a microlens, which is not shown, is incident on the photoelectric converter section 2, and a signal charge corresponding to an amount of the incident light is accumulated. For example, as shown in FIG. 2, a plurality of the unit pixel sections 14, each including the above-described transistor 1, an amplifying transistor 7 which amplifies an output of the transistor 1, a reset transistor and the like, is situated in a photoreceptor region 30 of a chip 20a in a matrix format. Further, in the peripheral circuit region 40, which is a peripheral region of the photoreceptor region 30, a vertical scanning circuit 15, a noise reduction circuit 16, a horizontal scanning circuit 17 and an amplifier circuit 18 are situated.

The vertical scanning circuit 15 selects a horizontal signal line, and a gate voltage is applied to the gate electrode 6 of the transistor 1 which is connected to the horizontal signal line, whereby a channel is formed in a surface of the well 5. Accordingly, the signal charge accumulated in the photoelectric converter section 2 is transferred to the drain region 4. In a vertical signal line, a voltage signal, which corresponds to an amount of the signal charge transferred to the drain region 4, is generated. Next, when the horizontal scanning circuit 17 selects vertical signal lines one by one, the voltage signal in a selected vertical signal line is noise-reduced in the noise reduction circuit 116, amplified or impedance-converted in the amplifier circuit 18, and then outputted externally from an output terminal 19. By repeating these processes, one image data is obtained.

To the reference voltage supply terminal 24, a first reference voltage Vss1 (a ground voltage) and a second reference voltage Vss2 (>0) are supplied switchingly. The supplied reference voltage is applied to the well 5 through a reference voltage wiring 12 which circles on the chip 20a. In the present embodiment, the first reference voltage Vss1 is a voltage applied to the well 5 mainly at the time of driving the peripheral circuit, and the second reference voltage Vss2 is a voltage applied to the well 5 mainly at the time of driving a circuit of the photoreceptor region 30 (at the time of exposure and at the time of transferring the signal charge).

FIG. 1(c) shows a potential of the surface of the well 5 when the second reference voltage Vss2 is applied to the well 5 and when the gate voltage is not applied to the gate electrode 6. The second reference voltage Vss2 is applied, whereby a potential in a region directly below the gate electrode 6 (hereinafter referred to as aback gate region 13) becomes almost zero (a pinning state), regardless of a position. This is because free electrons in the well 5 move towards a high potential point (a supply point of the second reference voltage Vss2), and consequently there is no free electron remaining in the back gate region 13.

Figure 3:
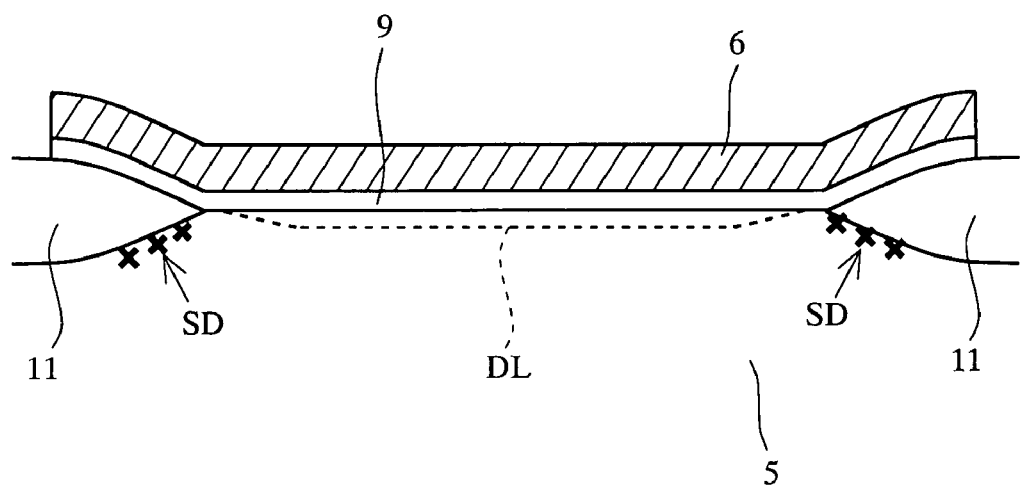
FIG. 3 is a diagram illustrating a position where a surface defect exists and an expansion of a depletion layer in a cross-section of FIG. 1(a) along a B-B' line.

FIG. 3 shows a surface defect SD and a depletion layer DL in a cross-section of FIG. 1(a) along a line B-B' when the second reference voltage Vss2 is applied to the well 5, and when the gate voltage is not applied to the gate electrode 6. In the case of applying the second reference voltage Vss2, which is equivalent to applying a forward bias to the well 5, the depletion layer DL becomes smaller compared to a case where the second reference voltage Vss2 is not applied. When the surface defect SD exists outside of the depletion layer DL, a movement of the free electrons in the surface defect SD is blocked by the depletion layer DL, and thus dark electrons will not be accumulated in the photoelectric converter section 2. Accordingly, a level of the second reference voltage Vss2 is set at a level such that the depletion layer DL will not reach the surface defect SD.

Figure 4:
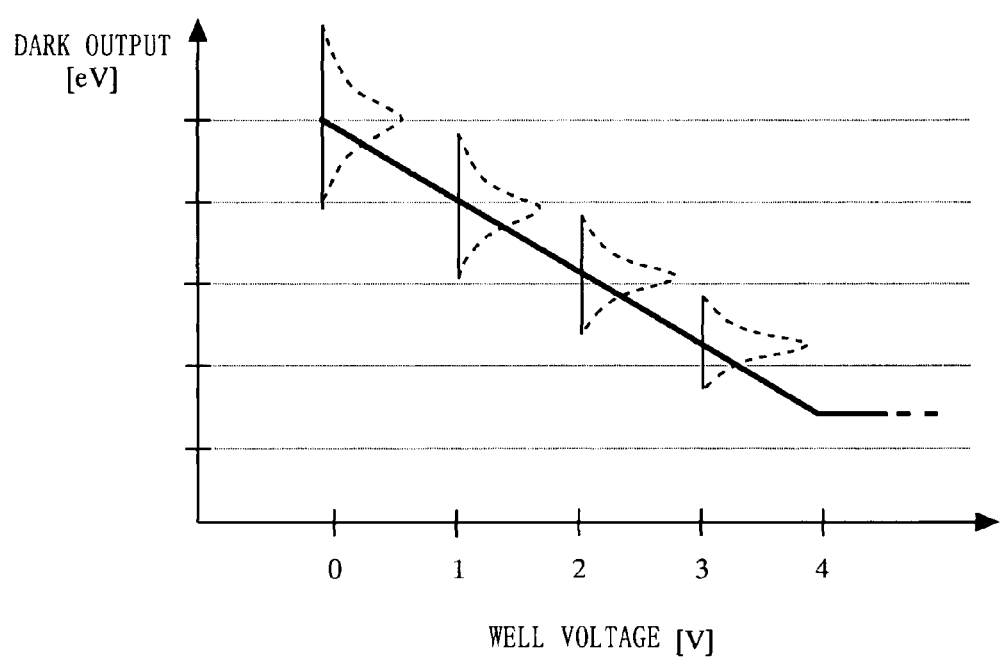
FIG. 4 is a diagram illustrating a relation between a well voltage and a dark output.

FIG. 4 shows a relation between the voltage applied to the well 5 and the dark output. A bold curve in the diagram indicates average dark outputs at respective voltages. Gaussian distributions represented by dotted lines at levels of 1, 2 and 3 Vs indicate distributions based on individual differences (device differences) of the dark output.

As FIG. 4 shows, when a well voltage stays within a voltage range between 0V and a saturation voltage (around 4V in FIG. 4), the dark output decreases linearly in proportion to the level of the voltage. When the well voltage exceeds the saturation voltage, the dark output does not change even if the applied voltage is changed. The level of the second reference voltage Vss2 is preferably set at the saturation voltage, in consideration of reduction in the dark output only, but in practice, may be set at an appropriate level in consideration of reduction in power consumption, a level of a power supply voltage Vdd supplied to the chip 20a, a circuit design and the like. According to an experiment performed by an inventor of the present invention without changing conditions other than the well voltage, the dark output in the case of the well voltage being 3V is equivalent to about 40% of the dark output in the case of 0V. At the same time, it is also confirmed that the individual difference is also reduced to about 50%.

Figure 5:
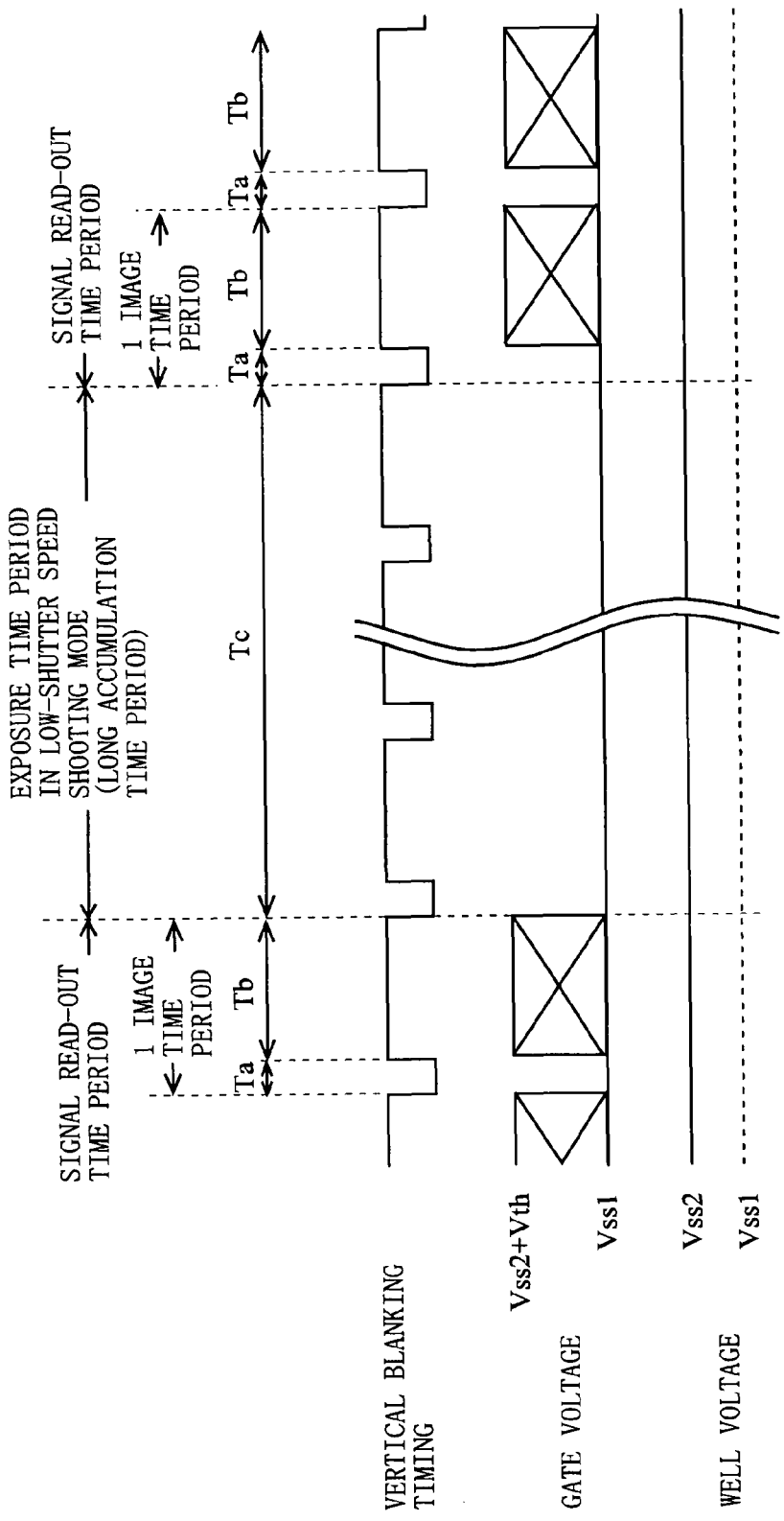
FIG. 5 is a timing chart illustrating an exemplary method for driving the solid-state imaging device according to the first embodiment of the present invention.

FIG. 5 is a diagram illustrating an exemplary method for driving the solid-state imaging device of the present invention, and shows a timing chart of a vertical blanking timing, the gate voltage and the well voltage. The solid-state imaging device according to the present invention includes a low shutter speed shooting mode to be described later. The low shutter speed shooting mode is a shooting mode used in a low-light environment. An exposure time period of the low shutter speed shooting mode is a time period during which a LOW level time period Ta and a HIGH level time period Tb of the vertical blanking timing are repeated several times, and specifically is 10 secs. or more, for example. In the present specification, an exposure time period of the low shutter speed shooting mode will be referred to as a "long accumulation time period".

A signal charge accumulated during the long accumulation time period is read out during a signal read-out time period after the exposure time period. More specifically, during the HIGH level time period Tb of the vertical blanking timing, the gate voltage is applied to respective gate electrodes 6 one by one, and the signal charge is transferred to the drain region 4 from the photoelectric converter section 2 of each of the unit pixel sections to which the gate voltage is applied. A time period during which the signal charge accumulated in one photoelectric converter section 2 is read out therefrom is called one image time period.

In order to transfer the signal charge from the photoelectric converter section 2 to the drain region 4 while the second reference voltage Vss2 is being applied to the well 5, a voltage of a level equal to or larger than a sum of a gate threshold voltage Vth and the second reference voltage Vss2 needs to be applied to the gate electrode 6. For example, when the gate threshold voltage Vth is 5V, and when the second reference voltage Vss2 is 3V, a voltage of 8V or more needs to be applied to the gate electrode, and thus the power supply voltage Vdd needs to be 8V or more.

In order to realize the solid-state imaging device according to the present embodiment, a power supply and a circuit, which supply the first reference voltage Vss1 and the second reference voltage Vss2 switchingly to the reference voltage supply terminal 24, need to be provided on the chip 20a or at an outside of the chip 20a. As the second reference voltage Vss2, the power supply voltage Vdd (>0V) supplied to the chip 20a or a voltage generated based on the power supply voltage Vdd may be used, or alternatively, other voltages than the power supply voltage Vdd may be used.

In the solid-state imaging device and the method for driving the same according to the present invention, the second reference voltage Vss2, which is different from the first reference voltage Vss1 (the ground voltage), is applied to the well 5, whereby the potential of the back gate region 13 becomes almost "0" regardless of the position. Accordingly, it is possible to suppress generation of the dark electrons, which has been a conventional problem. Therefore, according to the solid-state imaging device and the method for driving the same based on the present embodiment, it is possible to suppress the dark output at the time of the long accumulation, variation in the dark output of the unit pixel section and deterioration in a white spot defect. Further, it is possible to obtain a much preferable image since an after-image and a kTC noise are hardly generated.

Since the second reference voltage Vss2 is a positive voltage, unlike a case where the dark electrons are suppressed by applying a negative voltage to the gate electrode 6, a voltage whose polarity is different from the power supply voltage Vdd does not need to be prepared. Accordingly, a circuit configuration becomes simpler compared to the case where the voltage whose polarity is different from the power supply voltage Vdd needs to be prepared, whereby it is possible to realize miniaturization of a device.

Component parts of the unit pixel section 14 are not particularly limited except for the photoelectric converter section 2, the gate electrode 6 and the drain region 4. For example, the present invention may be applicable to a case where an active unit pixel section is adopted, which amplifies a signal by using an amplifier after voltage conversion in the drain region, or may be applicable to a case where a passive unit pixel section is adopted, which does not include the amplifier. Further, presence of the hole storage layer 3 and a configuration of the peripheral circuit are not particularly limited.

In the above description, the first reference voltage Vss1 is the ground voltage, however, the first reference voltage may be larger than 0V. In this case, the first reference voltage Vss1 is set at a level lower than the saturation voltage, and the second reference voltage Vss2 is set higher than the first reference voltage Vss1.

The conductivity type of the well 5, the hole storage layer 3, the photoelectric converter section 2, and the drain region 4 may be opposite to the above-described conductivity type. That is, in the case where the conductivity type of the well 5 and the hole storage layer 3 is the N-type, the conductivity type of the photoelectric converter section 2 and the drain region 4 may be set as the p-type. In this case, the second reference voltage Vss2 is set lower than the first reference voltage Vss1, by setting, for example, the first reference voltage Vss1 at 0V and the second reference voltage Vss2 at −3V, whereby it is possible to suppress the dark output. Therefore, it is desirable that the second reference voltage Vss2 is larger in an absolute value than the first reference voltage Vss1, and has the same polarity as the power supply voltage Vdd.

The solid-state imaging device of the present embodiment is particularly useful for a high-end single-lens flex digital still camera which requires high S/N at the time of low-light shooting, a home-use/professional-use digital still camera, a broadcast camera mainly directed to a high-vision moving images shooting, a camera for astronomical observation and the like.

Second Embodiment

Figure 6:
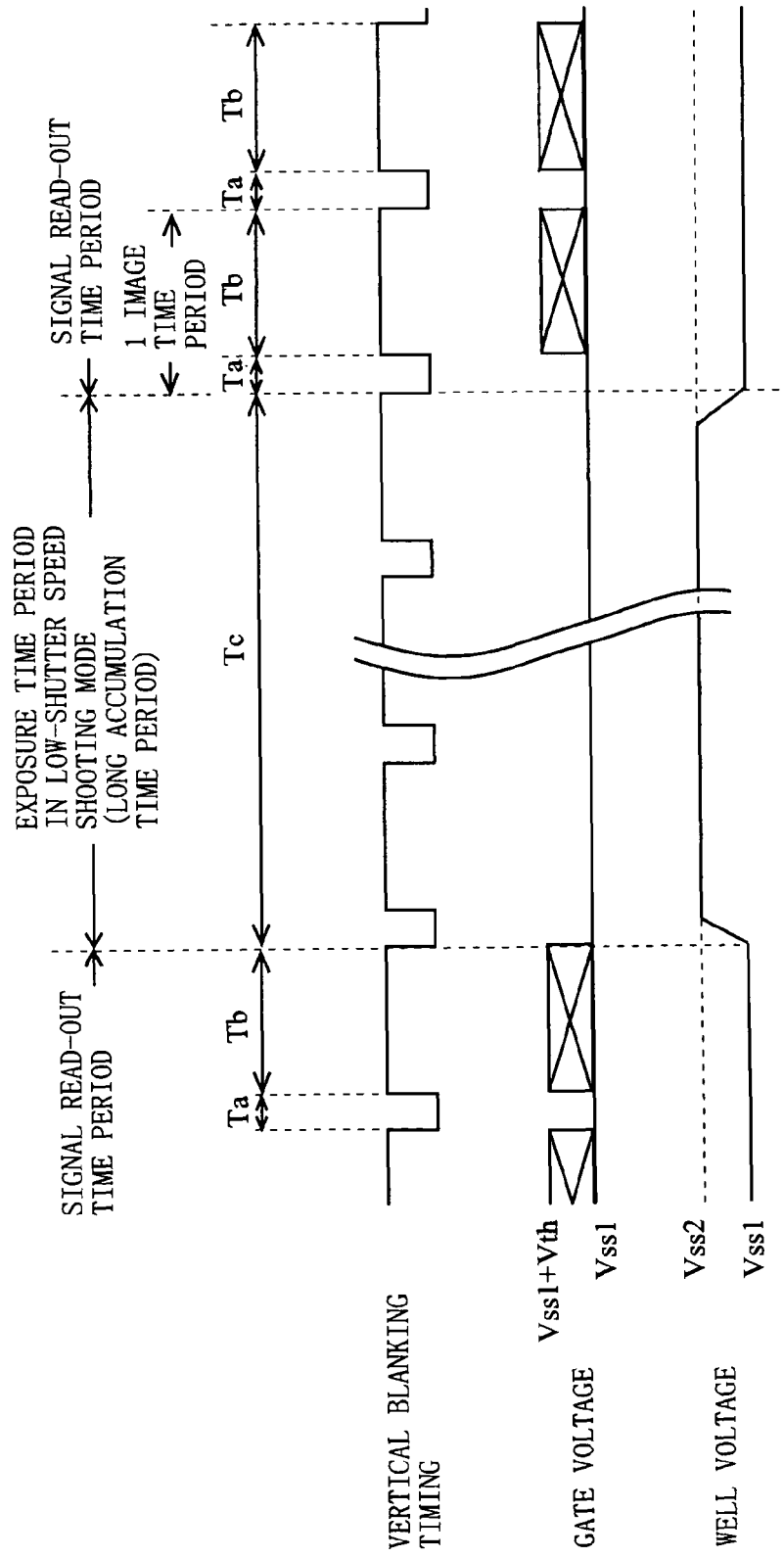
FIG. 6 is a timing chart illustrating an exemplary method for driving a solid-state imaging device according to a second embodiment of the present invention.

FIG. 6 is a diagram illustrating a solid-state imaging device and a method for driving the same according a second embodiment of the present invention, and shows a timing chart of a vertical blanking timing, a gate voltage and a well voltage. Since a device driven by the method is the same as that described in the first embodiment, a description thereof will be omitted.

In the method for driving the solid-state imaging device according to the present embodiment, the second reference voltage Vss2 (e.g., 3V) is applied to the well 5 only during the long accumulation time period, and during a remaining time period, the first reference voltage Vss1 (the ground voltage) is applied constantly. In this manner, in the case where the first reference voltage Vss1 is applied basically, and where the second reference voltage Vss2 is applied only during a time period when an effect of the dark output generated in the back gate region 13 is significant, it is possible to sufficiently suppress an increase in the dark output, variation in the dark output per pixel, deterioration in the white spot defect and the like, and in addition, a power supply voltage larger than the power supply voltage Vdd of the conventional solid-state imaging device is not required.

More specifically, if the first reference voltage Vss1 (the ground voltage) is applied to the well 5 when a voltage is applied to the gate electrode 6, the voltage to be applied to the gate electrode 6 at the time of transferring the signal charge may be equal to or larger than the threshold voltage Vth (e.g., 5V), as with the conventional case. Therefore, in the case where the second reference voltage Vss2 is applied to the well only during the long accumulation time period, power consumption of the solid-state imaging device can be reduced compared to a case where the second reference voltage Vss2 is also applied at the time of transferring the signal charge.

In the case where the exposure time period becomes longer, the effect of the dark electrons generated in the back gate region 13 becomes more significant, but may not lead to any problem in the case where the exposure time is short. Therefore, during an exposure time period for a shooting mode (normal shooting mode) having a shorter exposure time than the low-shatter speed shooting mode, the first reference voltage Vss1 is applied.

Third Embodiment

Figure 7:
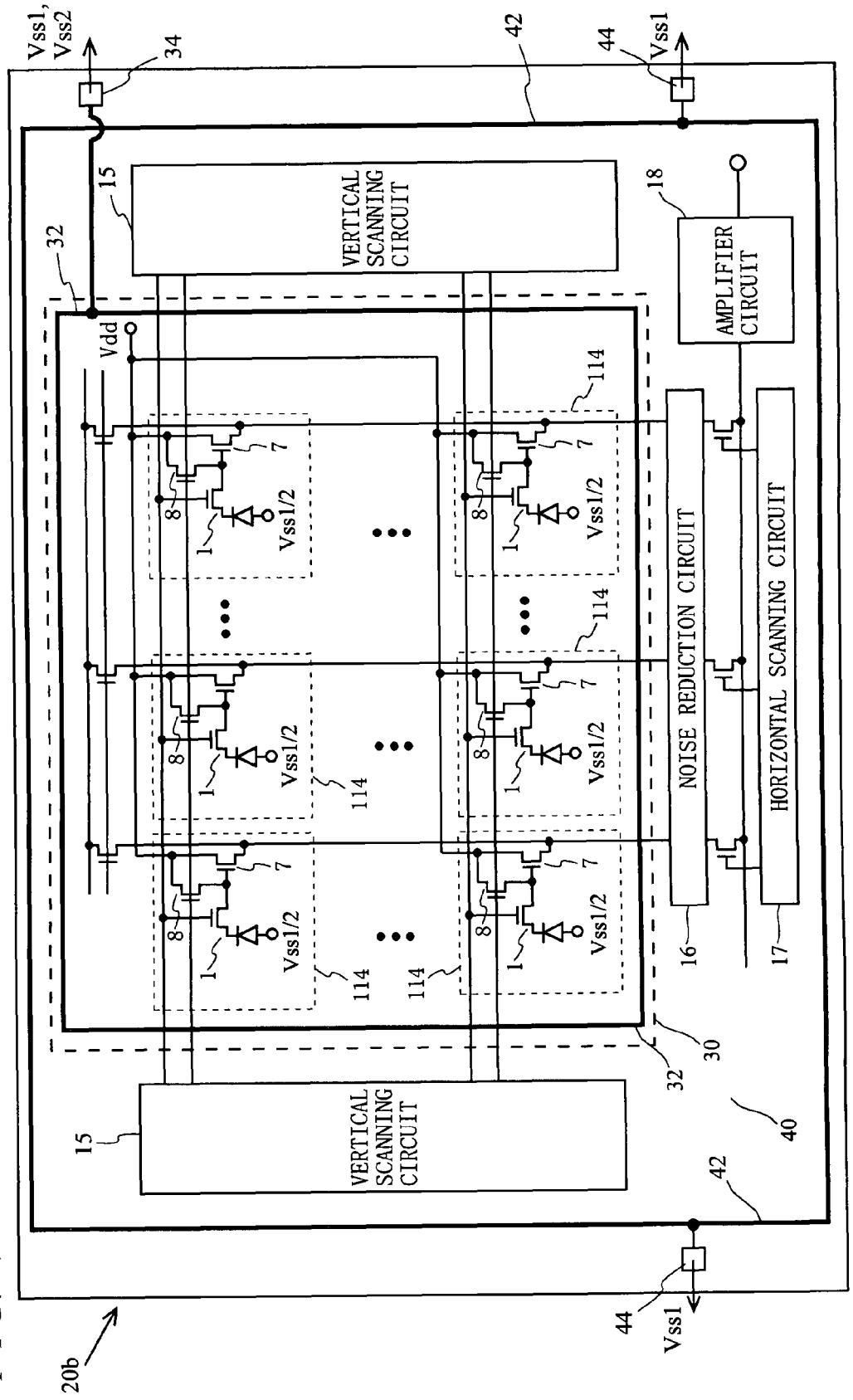
FIG. 7 is an exemplary circuit of a solid-state imaging device according to a third embodiment of the present invention.
Figure 8:
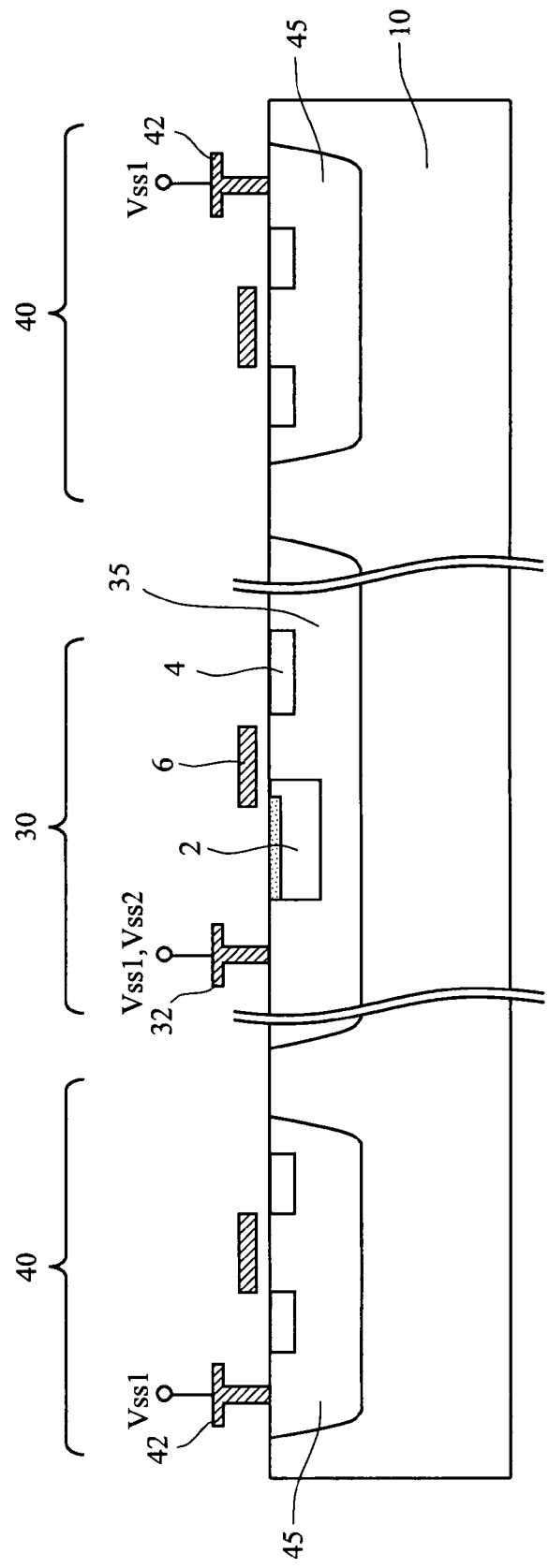
FIG. 8 is a schematic cross-sectional view of the solid-state imaging device as shown in FIG. 7.
Figure 9:
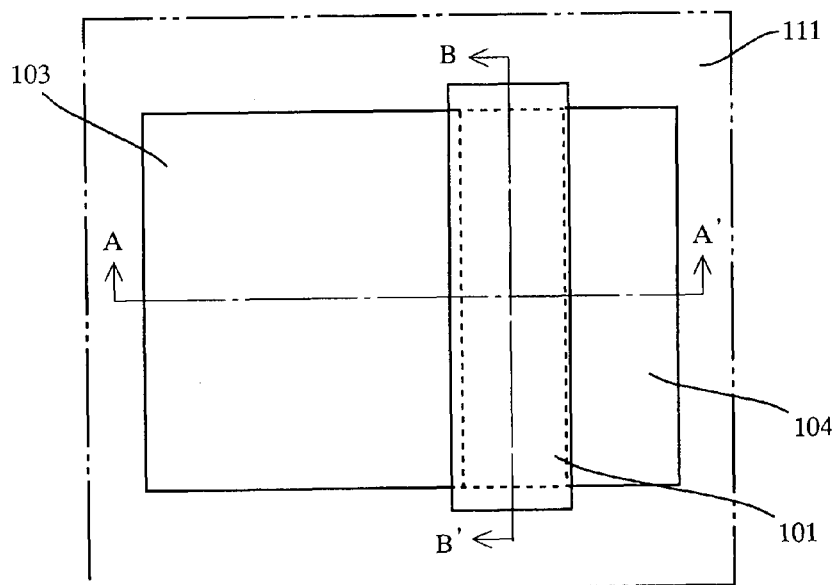
FIG. 9 is a diagram illustrating a partial top view, a cross-sectional view and a well surface potential of a unit pixel region of a conventional solid-state imaging device.
Figure 9:
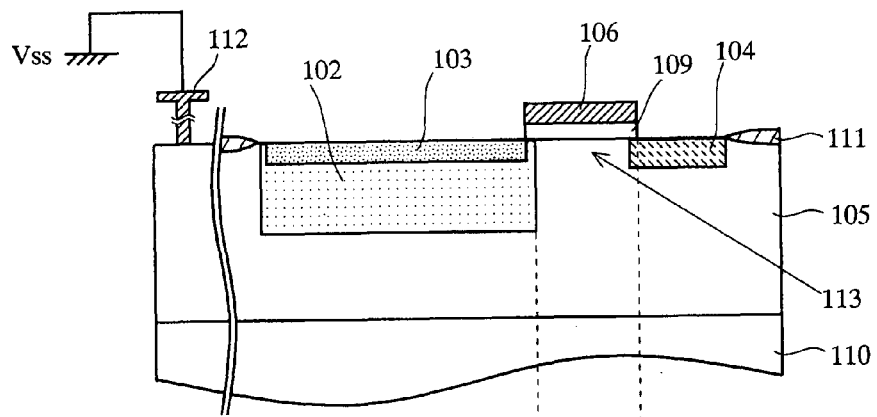
Figure 9:
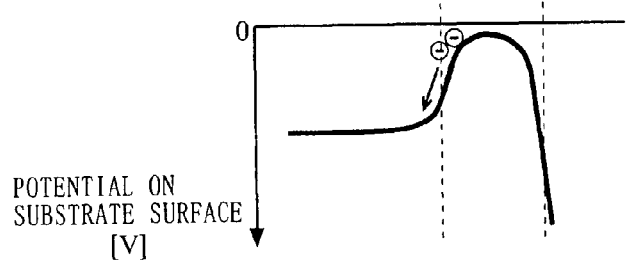
Figure 10:
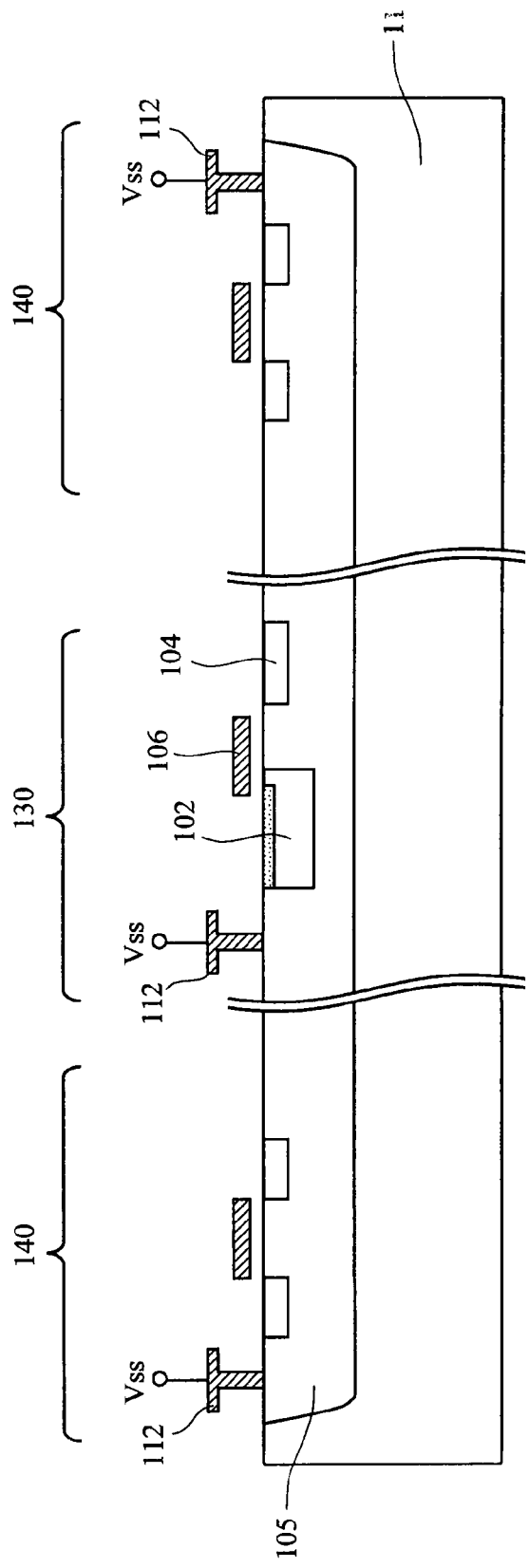
FIG. 10 is a schematic cross-sectional view of the conventional solid-state imaging device.
Figure 1:
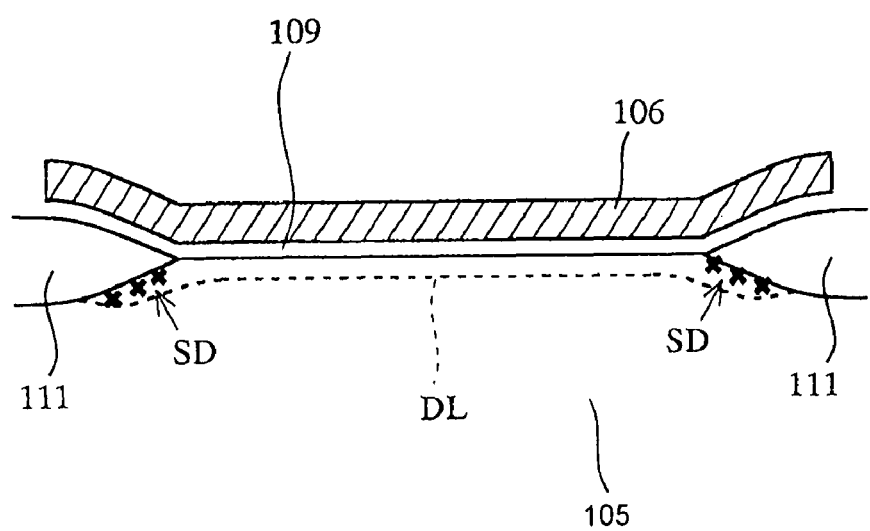

FIG. 7 is a circuit diagram of a solid-state imaging device according to a third embodiment of the present invention. FIG. 8 is a schematic cross-sectional view along a line passing through a vertical scanning circuit 15 and a photoreceptor region 30. In the solid-state imaging device according to the present embodiment, a peripheral circuit well 45, which is a well in a peripheral circuit region 40, is electrically separated and different from a photoreceptor section well 35, which is a well in a photoreceptor region 30.

To the reference voltage supply terminal 34, a first reference voltage Vss1 (a ground voltage) and a second reference voltage Vss2 (>0) are supplied switchingly. The supplied reference voltage is applied to the photoreceptor section well 35 through a photoreceptor section reference voltage wiring 32 which cycles on a chip 20b. Further, to the reference voltage supply terminal 44, the first reference voltage Vss1 (the ground voltage) is constantly supplied. The supplied reference voltage is applied to the peripheral circuit well 45 through a peripheral circuit reference voltage wiring 42 which cycles on the chip 20b. A configuration of the solid-state imaging device according to the present embodiment is the same as that of the solid-state imaging device according to the first embodiment, except for the above-described points.

As with the solid-state imaging device according to the present embodiment, by electrically separating the photoreceptor section well 35 and the peripheral circuit well 45 from each other, it is possible to apply different reference voltages to the respective wells at a simultaneous timing. That is, it is possible to apply the first reference voltage Vss1 to the peripheral circuit well 45 while applying the second reference voltage Vss2 to the photoreceptor section well 35. Therefore, it is possible to drive a peripheral circuit while applying the second reference voltage Vss2 to the photoreceptor section well 35 without preparing a power supply voltage which is different from the conventional power supply voltage or including an additional circuit configuration.

The well may not only be divided into two of the peripheral circuit region 40 and the photoreceptor region 30, but also be divided into further smaller pieces. If the well is divided into further smaller pieces, circuits on different wells can be driven at the simultaneous timing without changing remaining configuration, thus reduction in processing time or the like can be enhanced easily. More specifically, it is possible to reset a drain region by activating a vertical scanning circuit 15, for example, during the long accumulation time period.

INDUSTRIAL APPLICABILITY

The solid-state imaging device according to the present invention is particularly useful for a high-end single-lens flex digital still camera which requires high S/N at the time of low-light shooting, a home-use/professional-use digital still camera, a broadcast camera mainly directed to a high-vision moving images shooting, a camera for astronomical observation and the like.

The invention claimed is:

1. A solid-state imaging device, comprising:
a first well;
a second well;
a photoreceptor section reference voltage wiring; and
a peripheral circuit reference voltage wiring, wherein:
the first well and the second well are arranged in a semiconductor substrate,
the first well includes a photoreceptor section including unit pixels arranged in a matrix format, each of the unit pixels including at least:
  a photoelectric converter section which accumulates a signal charge obtained through a photoelectric conversion of an incident light;
  a drain region to which the signal charge is transferred; and
  a gate electrode which transfers the signal charge from the photoelectric converter section to the drain region,
the second well includes therein or thereon a peripheral circuit, the peripheral circuit including at least:
  a vertical scanning circuit;
  a horizontal scanning circuit; and
  an amplifier circuit,
the first well and the second well are a P-type well,
the first well is electrically separated and different from the second well,
the first well is connected to the photoreceptor section reference voltage wiring,
the second well is connected to the peripheral circuit reference voltage wiring,
the photoreceptor section reference voltage wiring switchingly supplies a first voltage which is equal to or more than 0 V and a second voltage which is higher than the first voltage and is more than 0 V to the first well so that the first voltage is applied to the first well during a signal read-out time period and the second voltage is supplied to the first well during an exposure time period, and the peripheral circuit reference voltage wiring supplies only the first voltage to the second well.

2. The solid-state imaging device of claim 1, wherein the second voltage is one of a power supply voltage supplied to the semiconductor substrate and a voltage generated based on the power supply voltage.

3. The solid-state imaging device of claim 1, wherein the second voltage is supplied separately from a power supply voltage.

* * * * *